United States Patent [19]
Kondo

[11] Patent Number: 4,691,120
[45] Date of Patent: Sep. 1, 1987

[54] PULSE DELAY CIRCUIT DEVICE

[75] Inventor: Hiroshi Kondo, Saitama, Japan

[73] Assignee: Toko, Inc., Tokyo, Japan

[21] Appl. No.: 924,022

[22] Filed: Oct. 28, 1986

[30] Foreign Application Priority Data

Oct. 29, 1985 [JP] Japan .................. 60-241847

[51] Int. Cl.⁴ ................ H03K 5/04; H03K 5/22; H03K 5/153; H03K 5/01
[52] U.S. Cl. .................. 307/265; 307/268; 307/608; 307/494; 307/360; 328/58; 328/147
[58] Field of Search ........... 307/290, 494, 555, 261, 307/360, 262, 265, 268; 328/58, 146, 147, 22, 26; 330/252, 254

[56] References Cited
U.S. PATENT DOCUMENTS 3,475,622 10/1969 Andersen et al. .................. 328/146
3,484,624 12/1969 Rasiel et al. ........................ 328/146
3,982,189 9/1976 Brooks et al. ....................... 328/22
4,268,762 5/1981 Ienaka et al. ....................... 307/268

Primary Examiner—Stanley D. Miller
Assistant Examiner—Trong Quang Phan

[57] ABSTRACT

In a pulse delay circuit device, a double-balanced type differential amplifier is provided which comprises a first and a second differential amplifier and is provided with a first and a second output stage. The design is made such that by rendering the differential amplifiers operative alternately, an output pulse having predetermined delay time and pulse width can be derived from each of the first and second output stages of the double-balanced type differential amplifier.

4 Claims, 5 Drawing Figures

PULSE DELAY CIRCUIT DEVICE

BACKGROUND OF THE INVENTION

1. Field of the Invention

This invention relates to a pulse delay circuit device which is so designed that the delay time and pulses width of an output pulse can be set up as desired and which is adapted for processing high-speed input pulse and thus can be most effectively employed for timing adjustment of logic circuit device such as computer or the like, for example.

2. Description of the Prior Art

Generally, a conventional variable delay circuit employs a variable delay line constituted by coils and capacitors. However, such an arrangement is disadvantageous in that its large external size leads to a low packaging density. A further disadvantage is such that satisfactory characteristics cannot always be achieved with respect to high-speed input pulse. Among the conventional variable delay circuits are one of the type in which a tap is mechanically switched to adjust the delay time; one of the type in which a tap is switched by means of a multiplexer; one of the type in which the delay time is adjusted by means of a slider, and so forth. However, the last-mentioned type is disadvantageous in that it requires that fine delay time adjustment be effected by moving the slider through the use of a jig. With the conventional variable delay lines, therefore, troublesome adjustment steps are involved, and a number of other steps are needed. Another disadvantage is such that great difficulty is encountered in an attempt to set up the width of output pulse as desired.

Delay circuits using transistors are disadvantageous in that difficulty is experienced in adjusting the width of output pulse as is the case with the above-mentioned types of variable delay lines; a high switching speed is difficult to achieve; and a complex circuit arrangement is required in an attempt to effect adjustment of pulse width.

SUMMARY OF THE INVENTION

The present invention has been made with a view to eliminating the aforementioned drawbacks of the prior art. It is a primary object of the present invention to provide a pulse delay circuit device comprising a simplified circuit arrangement which can be easily fabricated in the form of integrated circuit.

Another object of the present invention is to provide a pulse delay circuit device adapted for processing highspeed pulse.

A further object of the present invention is to provide a pulse delay circuit device adapted for processing time can be easily set up.

A still further object of the present invention is to provide a pulse delay circuit device which is so designed that the delay time and width of output pulse can be set up as desired.

Briefly stated, the pulse delay circuit device according to the present invention includes, as a basic circuit, a double-balanced type differential amplifier circuit which comprises a first differential amplifier comprising a first differential transistor pair having two input terminals, and a first current source transistor; and a second differential amplifier comprising a second differential transistor pair having two input terminals, and a second current source transistor. The double-balanced type differential amplifier is associated with an integrator circuit for integrating input pulse or shaping input pulse into a triangular waveform, and a first and a second reference voltage source each arranged to be capable of setting up a desired reference voltage level. One of the two input terminals of each of the first and second differential transistor pairs is connected to the integrator circuit, and the other input terminals of the first and second differential transistor pairs are coupled to the first and second reference voltage sources respectively. The output stages of the present pulse delay circuit device are arranged so that outputs at those ones of the transistors of the first and second differential transistor pairs which are connected to the integrator, are combined or summed and outputs of the opposite side transistors are also combined or summed. With such an arrangement, by setting up the voltage levels of the first and second reference voltage sources as desired, and by causing the first and second current source transistors to be alternately operated in synchronism with said input pulse, it is possible to derive output pulse having predetermined delay time and pulse width from each of the output stages of the double-balanced type differential amplifier.

Other objects, features and advantages of the present invention will become apparent from the ensuing description taken in conjunction with the accompanying drawings.

DESCRIPTION OF THE PREFERRED EMBODIMENTS

Figure 1:
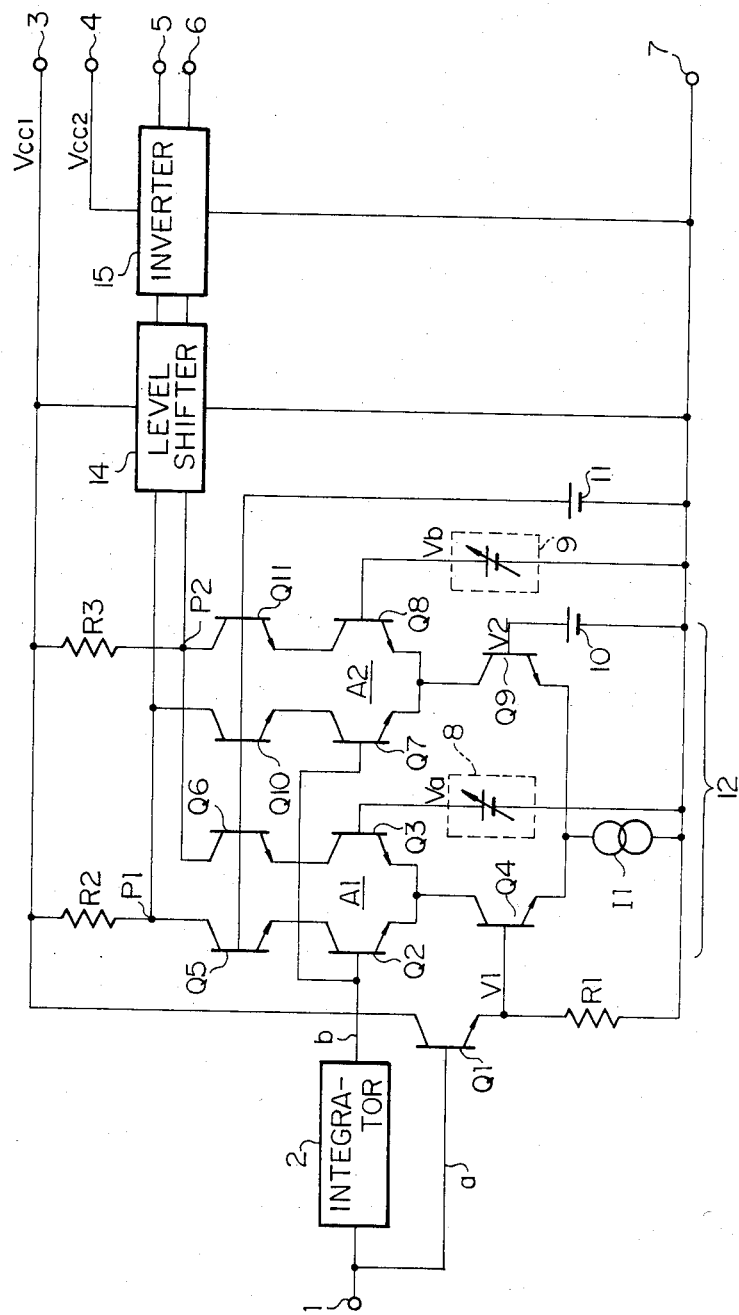
FIG. 1 is a circuit diagram showing the pulse delay circuit device according to an embodiment of the present invention.

Referring to FIG. 1 of the accompanying drawings, there is illustrated the pulse delay circuit according to an embodiment of the present invention, which includes an input terminal 1; an integrator circuit 2 which transforms input pulse into a saw-tooth waveform or triangular waveform pulse; a terminal 3 connected to a voltage source $V_{cc1}$; another terminal 4 connected to another voltage source $V_{cc2}$; output terminals 5 and 6; a ground terminal 7; reference voltage sources 8 and 9 which are designed to provide desired reference voltages $V_a$ and $V_b$ respectively; bias voltage sources 10 and 11; a double-balanced type differential amplifier 12 comprising two differential amplifiers A1 and A2; a level shifter circuit 14; and an inverter circuit 15.

In the double-balanced type differential amplifier 12, the differential amplifier A1 comprises differentially paired transistors Q2 and Q3 and a current source transistor Q4; and the differential amplifier A2 comprises differentially paired transistors Q7 and Q8 and a current source transistor Q9, the differential amplifiers A1 and A2 being grounded through a constant current source circuit I1. Furthermore, at the output stage of the double-balanced type differential amplifier 12, the output terminals of the respective differential transistor pairs are connected to one end of a resistor R2 through transistors Q5 and Q10 and to one end of a resistor R3 through current source transistors Q6 and Q11, the other ends of the resistors R2 and R3 being connected to the voltage source terminal 3.

The input terminal 1 is connected to the integrator circuit 2 as well as to the base of a transistor Q1. The output terminal of the integrator circuit 2 is coupled to the bases of the transistors Q2 and Q7. The transistor Q1 has its emitter connected to a resistor R1 and the base of the current source transistor Q4 of the differential amplifier A1. The current source transistor Q9 of the differential amplifier A2 has its base connected to the bias voltage source 10. The current source transistors Q5, Q6, Q10 and Q11 have their base connected to the bias voltage source 11. The reference voltage sources 8 and 9 are connected to the base of the transistors Q3 and Q8 of the differential amplifiers A1 and A2.

Description will now be made of the operation of the pulse delay circuit of FIG. 1 with reference to the timing chart of FIG. 2.

Figure 2:
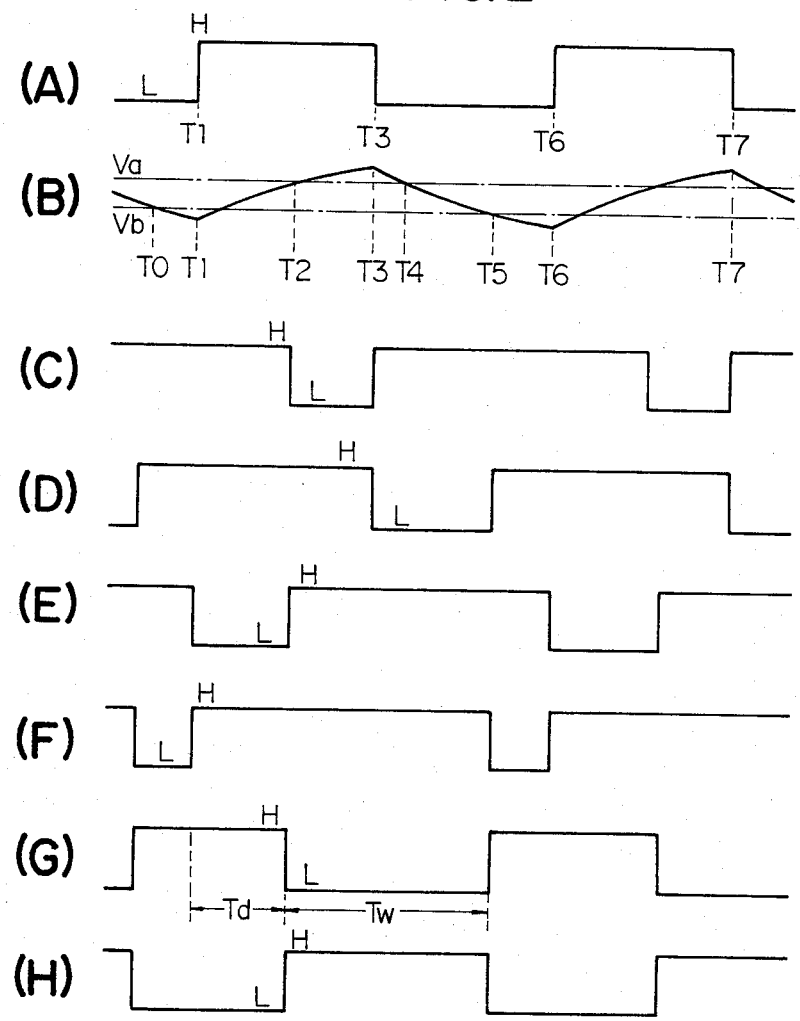
FIG. 2 is a timing chart useful for explaining the operation of the pulse delay circuit device of the present invention.

To the input terminal 1 is applied such a pulse of rectangular waveform as shown at (A) in FIG. 2 which in turn is processed in the integrator circuit 2 so as to be transformed into such an integrated waveform as shown at (B) in FIG. 2. More specifically, during the time period from time T1 to T3, a pulse of H (High) level is imparted to the input terminal 1 so that the transistor Q1 is turned on (in this state, the transistor is caused to operate under an unsaturated condition, and such a state will be referred to as "turned on" hereinafter); as a result, a voltage V1 is produced across the resistor R1 so that the transistor Q4 is turned on. Bias voltage V2 is applied from the bias voltage source 10 to the base of the transistor Q9, and due to the fact that the relationship between the bias voltages V1 and V2 is established to be V1>V2, the transistor Q9 is turned off (in this state, the transistor is not completely cut off but a small current is flowing therethrough, and such a state will be referred to as "turned off" hereinafter). Thus, when an input pulse of H-level is applied to the input terminal 1, the differential amplifier A1 is rendered operative, while the other differential amplifer. A2 is rendered non-operative (in this state, the differential amplifier is not completely turned off but a small current is flowing in the base of each transistor of the differential transistor pair of the differential amplifier, and such a state will be referred to as "rendered non-operative" hereinafter).

When the double-balanced type differential amplifier 12 is in the above-mentioned state, the output voltage b of the integrator circuit 2 builds up and goes above a voltage level Va set up by the reference voltage source 8, at time T2, and thereupon, the transistor Q2 is turned on so that an operating current is caused to flow in the transistor Q5 through the resistor R2. Needless to say, at this time, the transistors Q2 and Q5 are maintained under an operating condition in the unsaturated region. A potential which occurs at a connection point P1 is changed from H level to L (Low) level as shown in FIG. 2(C). The transistor Q10 is turned off since the differential amplifier A2 is rendered non-operative.

The output of the integrator circuit 2 further builds up, and the input pulse changes from H level to L level at time T3; as a result, the transistor Q4 is turned off so that the differential amplifier A1 is rendered non-operative. Meanwhile, the transistor Q9 is so biased with the bias voltage V2 as to be turned on so that the differential amplifier A2 is rendered operative. Because of the transistor Q4 being turned off as mentioned above, the collector current which has so far been flowing is now interrupted so that the potential at the connection point P1 is changed from L level to H level as shown in FIG. 2(C).

Conditions which occur during the time period from time T3 to time T6, will next be described. When the input pulse is changed from H level to L level, the potential at the output b of the integrator circuit 2 becomes lower as discharge proceeds therein. The transistor Q9 is now turned on so that the differential amplifier A2 is rendered operative; thus, the transistor Q10 is turned on and draws in a current from the resistor R2 so that the potential at the connection point P1 is reversed from H level to L level as shown in FIG. 2(D). The operating waveform of the transistor Q10 turns out to be as shown in FIG. 2(D). As the output level of the integrator circuit 2 decreases, it goes below the reference voltage level Vb at time T5; thereupon, the transistor Q7 is turned off. Thus, at the time T5, the potential at the collector of the transistor Q10 or at the connection point P1 is reversed from L level to H level, and maintained at the H level during the time period from the time T5 to time T7. In the foregoing description, it has been assumed that the output of the differential amplifier A1 is isolated from the output of the differential amplifier A2.

Output pulses, such as shown in FIGS. 2(C) and (D) derived from the differential amplifiers A1 and A2 constituting the double-balanced type differential amplifier 12 are combined or summed with each other at the point P1, and the resultant combined output such as shown in FIG. 2(G) is passed through the level shifter circuit 14 and inverter circuit 15 and then derived from the output terminal 5. As will be seen from FIG. 2(G), the combined reversed output is an output waveform which has delay time $Td(T2-T1=Td)$ and pulse width $Tw(T5-T2=Tw)$.

Further output pulses, such as shown in FIGS. 2(E) and (F), derived from the differential amplifiers A1 and A2 are combined or summed with each other at the point P2, and the combined output is passed through the level shifter circuit 14 and inverter circuit 15 and then derived from the output terminal 6. As will be seen from FIG. 2(H), the thus derived output is an inverted version of the output available at the output terminal 5.

Figure 4:
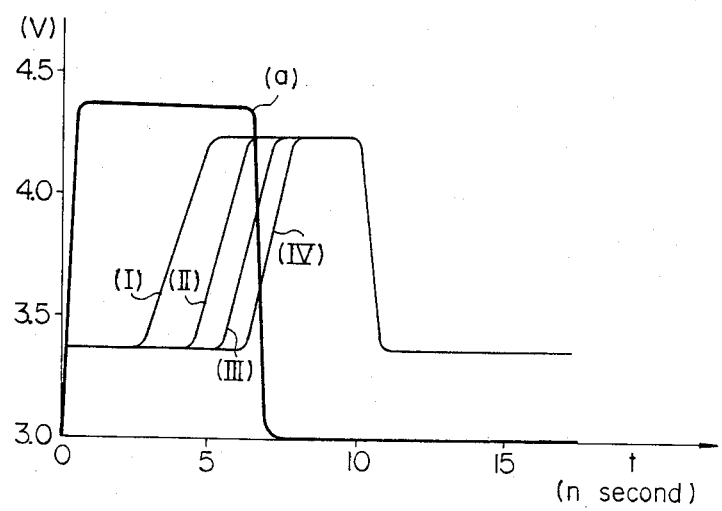
FIGS. 4 and 5 are views illustrating the characteristics of the pulse delay circuit device of the present invention.
Figure 5:
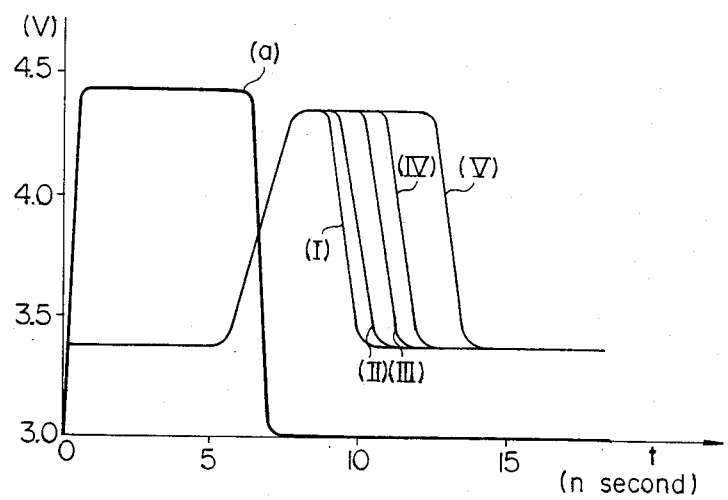

As will be appreciated from the above discussion, it is possible to set up, as desired, the delay time Td of the output as shown in FIG. 4, by suitably selecting the voltage level Va of the reference voltage source 8. In FIG. 4, the abscissa represents time (unit: nanosecond), and the ordinate indicates output voltage, wherein an input pulse is shown by (a), and output pulses generated by changing the value of the voltage level Va in four steps over the range from about 3.4 V to 4.1 V, are represented at (I)., (II), (III) and (IV), respectively. In this way, it is possible to achieve desired delay time Td by suitably setting up the voltage level Va of the reference voltage source 8. In FIG. 5, output pulses generated by changing the voltage level Vb of the reference voltage source 9 in five steps over the range from about 4.5 V to 3.5 V, are shown at (I), (II), (III), (IV) and (V), respectively, by way of example. It is possible to adjust the pulse width Tw of the output as desired, by suitably setting up the voltage level Vb of the reference voltage source. Obviously, it is possible to achieve desired delay time Td and pulse width Tw by adjusting both of the voltage levels Va and Vb.

The reference voltage sources 8 and 9 may be semi-fixed ones. In any case, desired DC voltages Va and Vb can be set up by external bit control signals generated by using a D/A converter circuit.

Figure 3:
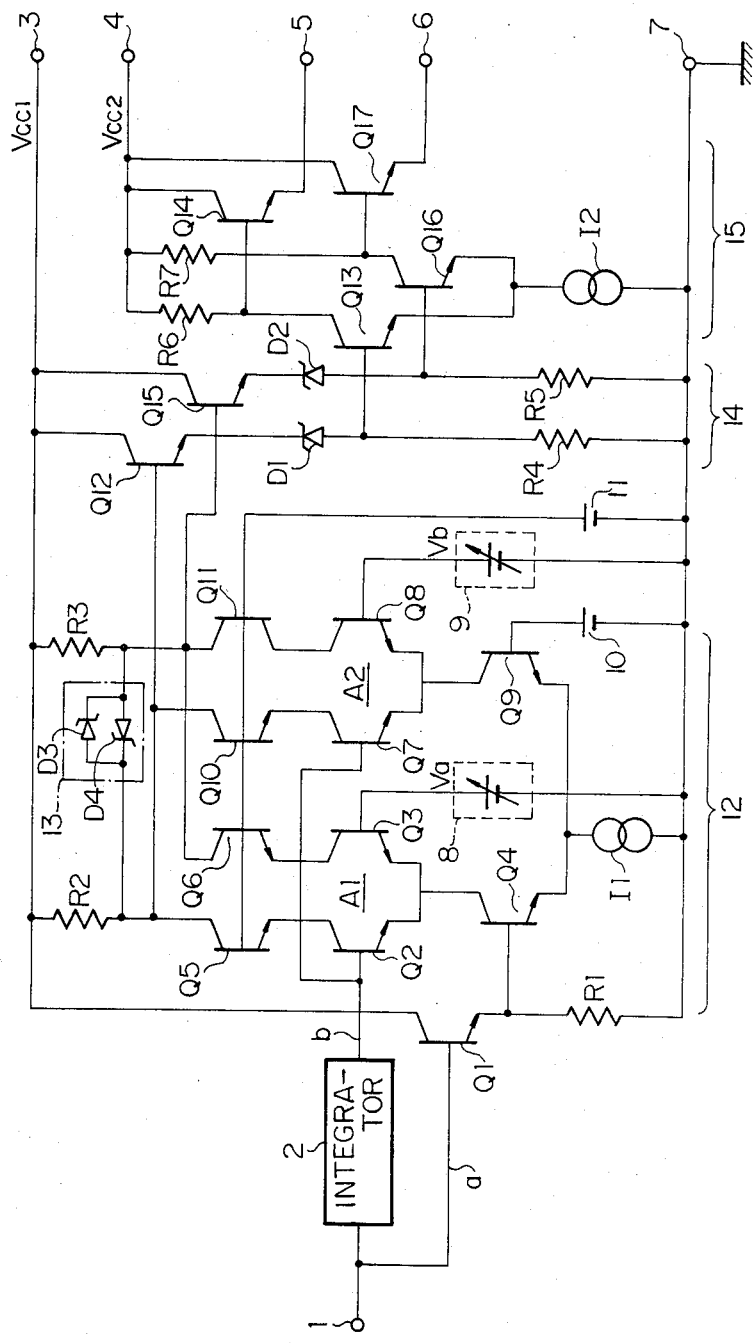
FIG. 3 is a circuit diagram showing the pulse delay circuit device according to another embodiment of the present invention.

Referring to FIG. 3, there is shown the pulse delay circuit device according to a second embodiment of the present invention, together with examples of level shifter circuit 14 and inverter circuit 15. Connected between the output stages of the differential amplifiers A1 and A2 is a clamping circuit 13 comprising two Schottky barrier diodes which are connected in reverse polarity with each other. With such an arrangement, the differential amplifiers A1 and A2 are enabled to operate only in the linear range of the characteristics thereof, so that a rapidly rising-up output signal can be generated. It will be appreciated that the pulse delay circuit device according to this embodiment responds to a faster pulse signal.

Current source transistors Q5, Q6, Q10 and Q11 connected to the collectors of transistors Q2, Q3, Q7 and Q8, are biased all the time, and thus switching time can be minimized when the differential amplifiers A1 and A2 are operated.

As will be appreciated, the pulse delay circuit device according to the present invention may be provided in the form of a semiconductor device using dielectric-isolation type transistors, and with such an arrangement, it will be apparent that improved electrical characteristics can be achieved.

As discussed above, with the pulse delay circuit device of the present invention, such output pulse waveforms as shown in FIGS. 4 and 5 can be generated by suitably setting up the voltage levels Va and Vb. Another advantage is such that the delay time and pulse width of the output pulse waveform can be very easily set up simply by suitably setting up the voltage levels of the reference voltage sources. The pulse delay circuit device of this invention is characterized in that its circuit arrangement is greatly simplified, and can readily be provided in the form of a semiconductor integrated circuit so that miniaturization is possible. Furthermore, a higher switching speed can be achieved with the pulse delay circuit device of the present invention wherein current source transistors which are biased all the time are connected to the output stages thereof and transistors constituting the present pulse delay circuit are caused to operate under an unsaturated condition; thus, according to the present invention, it is possible to provide an improved pulse delay circuit device which can respond to high-speed pulse signals.

Still furthermore, according to the present invention, the clamping circuit is connected between the output stages of a double-balanced type differential amplifier so that differential amplifiers constituting the double-balanced type differential amplifier are enabled to operate in the linear range of their characteristics. Thus, according to this aspect of the present invention, it is possible to provide a pulse delay circuit device which can respond to faster pulse signals.

While the present invention has been illustrated and described with respect to specific embodiments thereof, it is to be understood that the present invention is by no means limited thereto but encompasses all changes and modifications which will become possible within the scope of the appended claims.

I claim:

1. A pulse delay circuit, comprising:
    a double-balanced type differential amplifier means including a first differential amplifier comprising a first differential transistor pair having two input terminals and arranged to provide a first and a second output and a first current source transistor, and a second differential amplifier comprising a second differential transistor pair having two input terminals and arranged to provide a first and a second output and a second current source transistor;
    an integrator for integrating an input pulse, said integrator being connected to one of the two input terminals of each of said first and second differential transistor pairs;
    a first and a second reference voltage source connected to the other input terminals of said first and second differential transistor pairs, respectively;
    a first output stage arranged to combine the first outputs of said first and second differential transistor pairs, and a second output stage arranged to combine the second outputs of said first and second differential transistor pairs; and
    means for causing said first and second current source transistors to be turned on in synchronism with said input pulse so as to render said first and second differential amplifiers operative alternately, so that an output pulse having predetermined delay time and pulse width is derived from each of said first and second output stages of said double-balanced type differential amplifer means.

2. A pulse delay circuit device according to claim 1, further comprising a clamping circuit connected between the first and second output stages of said double-balanced type differential amplifer means, said clamping circuit comprising two Schottky barrier diodes connected in reverse polarity with each other.

3. A pulse delay circuit device according to claim 1, further comprising current source transistors which are biased all the time, said current source transistors being connected to the collectors of the transistors constituting said first and second differential transistor pairs.

4. A pulse delay circuit device according to claim 1, wherein each of the transistors constituting the pulse delay circuit device is adapted to be operated under an unsaturated condition.

* * * * *